United States Patent
DeBrosse

(10) Patent No.: US 9,373,383 B2
(45) Date of Patent: Jun. 21, 2016

(54) STT-MRAM SENSING TECHNIQUE

(71) Applicant: INTERNATIONAL BUSINESS MACHINES CORPORATION, Armonk, NY (US)

(72) Inventor: John DeBrosse, Colchester, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 89 days.

(21) Appl. No.: 14/484,742

(22) Filed: Sep. 12, 2014

(65) Prior Publication Data

US 2016/0078914 A1    Mar. 17, 2016

(51) Int. Cl.
*G11C 7/00* (2006.01)
*G11C 11/16* (2006.01)

(52) U.S. Cl.
CPC .................. *G11C 11/1673* (2013.01)

(58) Field of Classification Search
CPC ................................ G11C 11/1673
USPC ................................ 365/205, 158
See application file for complete search history.

(56) References Cited

U.S. PATENT DOCUMENTS

| | | | |
|---|---|---|---|
| 5,237,533 A | 8/1993 | Papaliolios | |
| 5,508,958 A | 4/1996 | Fazio et al. | |
| 5,751,635 A * | 5/1998 | Wong | G11C 11/5621 327/93 |
| 5,880,988 A * | 3/1999 | Bertin | G11C 7/14 365/104 |
| 6,094,394 A | 7/2000 | La Rosa | |
| 6,185,143 B1 | 2/2001 | Perner et al. | |
| 6,269,040 B1 * | 7/2001 | Reohr | G11C 7/06 365/190 |
| 6,317,356 B1 | 11/2001 | Hoffmann et al. | |
| 6,396,733 B1 | 5/2002 | Lu et al. | |
| 6,462,981 B2 * | 10/2002 | Numata | G11C 11/15 365/158 |
| 6,590,805 B2 | 7/2003 | Lu et al. | |
| 6,600,690 B1 | 7/2003 | Nahas et al. | |
| 6,693,826 B1 | 2/2004 | Black, Jr. et al. | |
| 6,816,403 B1 | 11/2004 | Brennan et al. | |
| 6,870,760 B2 | 3/2005 | Tsang | |
| 6,917,534 B2 | 7/2005 | Baker | |
| 6,946,882 B2 | 9/2005 | Gogl et al. | |
| 7,002,865 B2 | 2/2006 | Agata et al. | |
| 7,095,667 B2 | 8/2006 | Baker | |
| 7,236,415 B2 | 6/2007 | Forbes et al. | |
| 7,239,537 B2 | 7/2007 | DeBrosse et al. | |

(Continued)

OTHER PUBLICATIONS

Bonaccio, A., "Offset-Cancelling Self-Reference STT-MRAM Sense Amplifier" Related Application, U.S. Appl. No. 14/580,589, filed Dec. 23, 2014.

(Continued)

*Primary Examiner* — Viet Q Nguyen
(74) *Attorney, Agent, or Firm* — Cantor Colburn LLP; Vazken Alexanian

(57) ABSTRACT

Embodiments are directed to a system for sensing a data state of a selected memory cell. The system includes a first reference cell, a sample-and-hold sense amplifier and a switching system. During a first sensing phase the switching system is configured to open a first series communication path that places the selected memory cell in series with the first reference cell, thereby creating a first series voltage divider. During the first sensing phase, the switching system is further configured to open a first branch communication path that taps an input of the sample-and-hold sense amplifier into a first divided voltage between the selected memory cell and the first reference cell.

20 Claims, 12 Drawing Sheets

(56) References Cited

U.S. PATENT DOCUMENTS

| | | | | |
|---|---|---|---|---|
| 7,345,512 | B2* | 3/2008 | Tran | G11C 7/062 327/52 |
| 7,366,021 | B2* | 4/2008 | Taylor | G11C 7/062 365/185.21 |
| 7,453,751 | B2 | 11/2008 | Forbes et al. | |
| 7,701,763 | B2 | 4/2010 | Roohparvar | |
| 7,764,536 | B2 | 7/2010 | Luo et al. | |
| 7,787,319 | B2* | 8/2010 | Graber | G11C 7/067 365/205 |
| 8,116,122 | B2 | 2/2012 | Li et al. | |
| 8,482,950 | B2* | 7/2013 | Kitagawa | G11C 11/5678 365/189.05 |
| 2004/0120200 | A1 | 6/2004 | Gogl et al. | |
| 2004/0264249 | A1* | 12/2004 | Ho | G11C 7/062 365/185.21 |
| 2006/0067149 | A1* | 3/2006 | Shimizu | G11C 7/062 365/210.1 |
| 2007/0258301 | A1* | 11/2007 | Del Gatto | G11C 7/062 365/203 |
| 2008/0285360 | A1* | 11/2008 | Sakimura | G11C 7/02 365/189.15 |
| 2009/0027811 | A1 | 1/2009 | Guo et al. | |
| 2014/0153313 | A1* | 6/2014 | Boujamaa | G11C 7/14 365/148 |

OTHER PUBLICATIONS

DeBrosse, J., "Mismatch and Noise Insensitive STT MRAM," Related Application, U.S. Appl. No. 14/629,875, filed Feb. 24, 2015.
List of IBM Patents or Patent Applications Treated as Related; Mar. 5, 2015; pp. 1-2.
Zhang, Ruili et al., "Windowed MRAM Sensing Scheme", IEEE International Workshop on Memory Technology, Design and Testing, 2000, pp. 47-55.
Anthony R. Bonaccio, et al.; "Offset-Cancelling Self-Reference STT-MRAM Sense Amplifier"; U.S. Appl. No. 14/580,589, filed Dec. 23, 2014.
John K. Debrosse, et al.; "Mismatch and Noise Insensitive STT MRAM"; U.S. Appl. No. 14/749,167, filed Jun. 24, 2015.
List of IBM Patents or Patent Applications Treated as Related; Aug. 26, 2015; pp. 1-2.
Razavi, Behzad et al., "Design Techniques for High-Speed, High-Resolution Comparators", IEEE Journal of Solid-State Circuits, vol. 27, No. 12, 1992, pp. 1916-1926.
John K. Debrosse, et al.; "Mismatch and Noise Insensitive STT MRAM"; U.S. Appl. No. 14/629,875, filed Feb. 24, 2015.
List of IBM Patents or Patent Applications Treated as Related; Sep. 22, 2015; pp. 1-2.

* cited by examiner

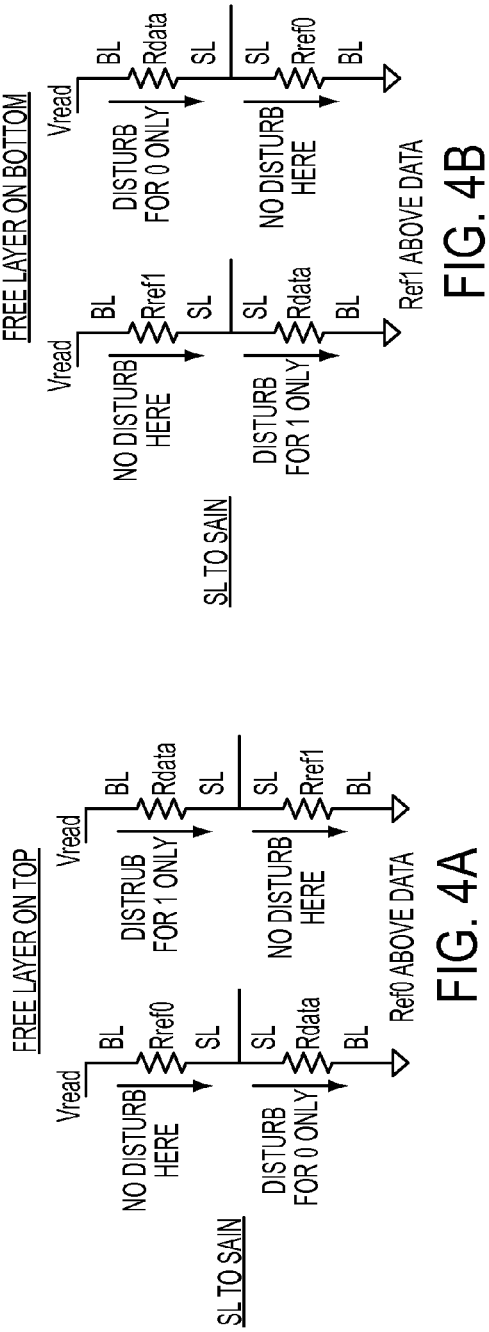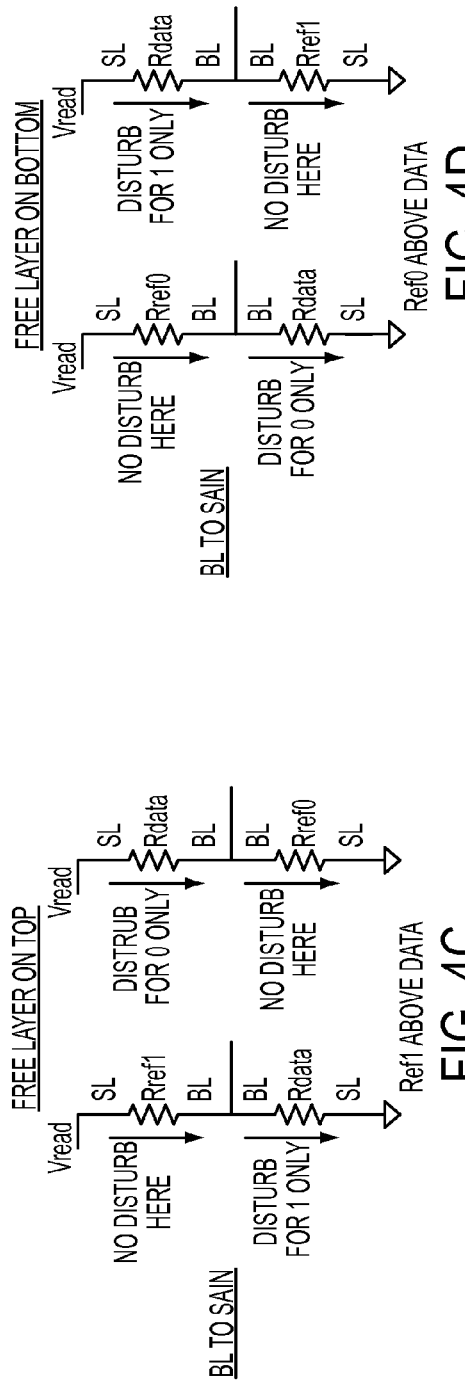

$$V_{signal} = V_{read} \cdot \left[ \frac{R_{data}}{R_{data} + R_{ref1}} - \frac{R_{ref0}}{R_{data} + R_{ref0}} \right]$$

$$V_{signal} = V_{read} \cdot \left[ \frac{R_{data}^2 - R_{ref0} R_{ref1}}{(R_{data} + R_{ref0}) \cdot (R_{data} + R_{ref1})} \right]$$

$$R_{ref} = R_{data}(V_{signal} = 0) = \sqrt{R_{ref0} R_{ref1}}$$

$$V_{signal\_nom} = +/- \frac{V_{read}}{2} \cdot \frac{MR}{(2 + MR)}$$

$$V_{disturb\_nom} = \frac{V_{read}}{2}$$

$$\frac{V_{signal\_nom}}{V_{distrub\_nom}} = \frac{MR}{(2 + MR)}$$

FIG. 4E

STT-MRAM SENSING TECHNIQUE

BACKGROUND

The present disclosure relates generally to electronic memory technology, and more specifically to sensing low voltage signals of a spin torque transfer magnetic random access memory (STT-MRAM).

STT-MRAM is an attractive emerging memory technology, offering non-volatility, high performance and high endurance. A typical STT-MRAM memory cell includes a magnetic tunnel junction (MTJ) in series with a field effect transistor (FET), which is gated by a word line (WL). A bit line (BL) and a source line (SL) run parallel to each other and perpendicular to the WL. The BL is connected to the MTJ, and the SL is connected to the FET. One memory cell along the BL is selected by turning on its WL. When a relatively large voltage (e.g., 500 mV) is forced across the cell from BL to SL, the selected cell's MTJ is written into a particular state, which is determined by the polarity of this voltage (BL high vs. SL high).

When the cell is in a logic zero (0) or parallel state, its MTJ resistance is lower than when the cell is in a logic one (1) or anti-parallel state. Typical MTJ resistance values would include $R_0=10$ KΩ and $R_1=20$ KΩ. A selected cell is read by sensing the resistance from BL to SL. The "sense" or "read" voltage must be much lower than the write voltage in order to clearly distinguish write and read operations, and to avoid inadvertently disturbing the cell during a read operation. Thus, sensing methodologies must be capable of accurately sensing very low read voltage (e.g., less than 50 mV).

BRIEF SUMMARY

Embodiments are directed to a system for sensing a data state of a selected memory cell. The system includes a first reference cell, a sample-and-hold sense amplifier and a switching system. During a first sensing phase the switching system is configured to open a first series communication path that places the selected memory cell in series with the first reference cell, thereby creating a first series voltage divider. During the first sensing phase, the switching system is further configured to open a first branch communication path that taps an input of the sample-and-hold sense amplifier into a first divided voltage between the selected memory cell and the first reference cell.

Embodiments are further directed to a method for sensing a data state of a selected memory cell. The method includes, during a first sensing phase, opening a first series communication path that places the selected memory cell in series with a first reference cell, thereby creating a first series voltage divider. The method further include, during the first sensing phase, opening a first branch communication path that taps an input of a sample-and-hold sense amplifier into a first divided voltage between the selected memory cell and the first reference cell.

Additional features and advantages are realized through the techniques described herein. Other embodiments and aspects are described in detail herein. For a better understanding, refer to the description and to the drawings.

BRIEF DESCRIPTION OF THE SEVERAL VIEWS OF THE DRAWINGS

The subject matter which is regarded as the present disclosure is particularly pointed out and distinctly claimed in the claims at the conclusion of the specification. The foregoing and other features and advantages are apparent from the following detailed description taken in conjunction with the accompanying drawings in which:

FIGS. 4A-4D illustrate how the series voltage divider configuration of the present disclosure may be chosen to ensure that the first and second reference cells are not disturbed during sensing;

FIG. 4E lists expressions for the signal voltage, equivalent reference resistance and the ratio of nominal signal to nominal disturb voltage;

Figure 1A:
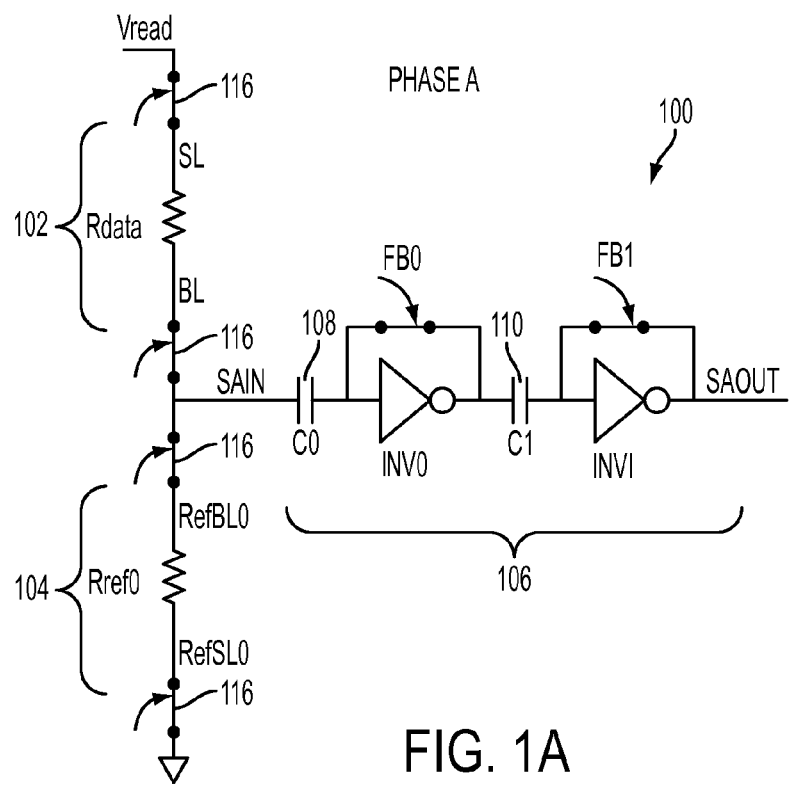
FIG. 1A is a schematic diagram of a first phase and configuration of a sensing circuit in accordance with one or more embodiments.

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION

Various embodiments of the present disclosure will now be described with reference to the related drawings. Alternate embodiments may be devised without departing from the scope of this disclosure. It is noted that various connections are set forth between elements in the following description and in the drawings. These connections, unless specified otherwise, may be direct or indirect, and the present disclosure is not intended to be limiting in this respect. Accordingly, a coupling of entities may refer to either a direct or an indirect connection.

As previously noted herein, when the cell is in a logic zero (0) or parallel state, its MTJ resistance is lower than when the cell is in a logic one (1) or anti-parallel state. Typical MTJ resistance values would include $R_0=10$ KΩ and $R_1=20$ KΩ. A selected cell is read by sensing the resistance from BL to SL. The "sense" or "read" voltage must be much lower than the write voltage in order to clearly distinguish write and read operations, and to avoid inadvertently disturbing the cell during a read operation. Thus, sensing methodologies must be capable of accurately sensing very low read voltage (e.g., less than 50 mV).

However, random device variations (e.g., dimensions and other parameters) can lead to corresponding variations in $R_0$ and $R_1$. For very small MTJs, the actual distributions of $R_0$ and $R_1$ for a particular device may in practice overlap, although $R_1$ is in theory expected to be greater than $R_0$. In this case, it is impossible to use the same reference resistance to discriminate a logic zero (0) from a logic one (1) for all bits. In a proposed solution, known as self-referencing, the data state resistance is sensed and stored, the cell is written to a known reference state, and then the reference state resistance is sensed. Based on a change in resistance (from data to reference), or a lack thereof, the original data state can be determined.

Random device variations can also lead to variations in the threshold voltage and trans-conductance of silicon FETs, even for devices in close proximity. This effect, known generally as FET mismatch, results in random offsets in various circuits, particularly those circuits that include FET configurations such as amplifiers and comparators. Thus, FET mismatch can determine the lower limit for its read voltage. For example, using a standard amplifier/latch configuration, assume that the read voltages for logic zero (0) and logic 1 are 50 mV and 100 mV, respectively. In this case, the optimal voltage at the reference input of the latch is 75 mV, and the nominal signal (i.e., reference voltage minus data voltage) is approximately 25 mV, with the polarity depending on the data state. If the offset of the latch varies randomly by as much as 25 mV due to FET mismatch, there is zero margin (i.e., nominal signal minus variation) in the worst case. Increasing the read voltages would increase the margin. However, the lack of margin prevents the read voltages from being lowered.

Offset-cancellation is a technique used in analog circuit designs to minimize the effects of FET mismatch. In a typical offset-cancellation technique applied to an amplifier circuit, during a first phase the amplifier offset is determined and stored on one or more capacitors. The circuit is then re-configured, and during the second phase the capacitors act to cancel out the amplifier offset, ideally resulting in zero (0) offset. In reality, some offset still remains but has been significantly reduced.

The present disclosure describes STT-MRAM sensing systems and methodologies, which are largely insensitive to as-manufactured and age-related FET mismatch, provide control of the applied read voltage, allow a very simple area and power efficient sense amplifier, and are compatible with advanced node technologies.

Turning now to an overview of the disclosed embodiments, during a first sensing phase (Phase A), the selected data cell and a first reference cell are connected in series by way of their bit lines (BLs) and source lines (SLs) to form a first resistive series voltage divider. A small read voltage (Vread) is applied across the first resistive series voltage divider, and the center tap or output is connected to the sense amplifier input node (SAIN) of a capacitively-coupled, sample-and-hold sense amplifier. The sample-and-hold sense amplifier samples the voltage at the SAIN node just prior to the end of Phase A.

During a second sensing phase (Phase B), the selected data cell and a second reference cell, having an opposite state to the first reference cell, are connected in series. In the Phase B, the second reference cell is placed at a higher voltage potential than the selected data cell. Vread is similarly applied across the Phase B series voltage divider. However, if the selected data cell was previously in the upper half of the divider (i.e., connected to the more positive input voltage), it is now in the lower half, and vice-versa. The center tap of the Phase B series voltage divider is again connected to the SAIN of the capacitively-coupled, sample-and-hold sense amplifier. The sample-and-hold sense amplifier, now in the hold phase, amplifies the voltage difference at SAIN between the end of Phase A and the end of Phase B to determine the sense amplifier output (SAOUT), which represents the state of the selected data cell.

Typically, the forced parameter (e.g., Vread for a current sense scheme, and Tread for a voltage sense scheme) of a sensing circuit is either generated by local circuitry (e.g., the sense amplifier) or further processed by local circuitry (e.g., generating Vread/2). These configurations require that some portion of the local circuitry is devoted to the generation and control of the forced parameter. The sensing systems and methodologies of the present disclosure allow the use a globally generated and controlled forced parameter (e.g., Vread). Thus, the present disclosure uses system-level area and power to generate and control the forced parameter at a relatively lower cost. Further, the forced parameter of the present disclosure is twice that of the current sense method because it is forced across two cells in series, allowing better control on a percentage basis. Additionally, combining the disclosed globally generated forced parameter scheme with offset cancelling provides significant protection against sensing errors in sensing systems that must be able to detect/sense very low sense parameters.

The simplicity of the disclosed system and methodology, particularly the simple series voltage divider configurations between the selected data cell and the two reference cells, provides a number of benefits. The present disclosure matches easily with offset cancellation techniques making comparison of the sensed parameter largely insensitive to as-manufactured and age-related FET mismatch. The disclosed systems and methodologies are very power efficient because they draw only one cell current from the system power supply because the data cell current also passes through the reference cells. The very simple series voltage divider cell configuration allows for a similarly simple sensing amplifier, both of which support low power. Because the sensing amplifier design may be implemented as a CMOS inverter, which is the most fundamental circuit in CMOS logic, the design is highly compatible with advanced node technologies.

Additionally, the disclosed sensing technique provides a methodology to ensure that the reference cells are not disturbed during sensing. The selected data cell may be assigned to either the upper or lower half of the series voltage divider during Phase A, as long as it is assigned to the opposite half during Phase B. However, the decision as to which reference state to put above the data cell during either phase (and therefore which state to put below the data cell during the opposite phase) is an important choice that affects the read disturb characteristics. Based on the position of the free layer (above the fixed layer and therefore connected to the BL, or below the fixed layer and therefore connected to the array FET and SL) and upon whether the BLs or SLs are connected to SAIN (a design choice driven by other considerations), the reference states should be assigned consistent with FIGS. 4A-4D (described in more detail later in this disclosure). This assignment ensures that the reference cells are not disturbed because the polarity of the sensing bias applied to the reference cells is same as the polarity of the write voltage for that particular reference state. The assignment also ensures that the data cell is only disturbed for one of the two phases, and that the magnitude of the disturb voltage is nominally Vread/2. For reference, it is a feature of STT MTJs that positive current into the free layer terminal will write the MTJ into the low resistance or zero (0) state, and vice-versa.

Figure 1B:
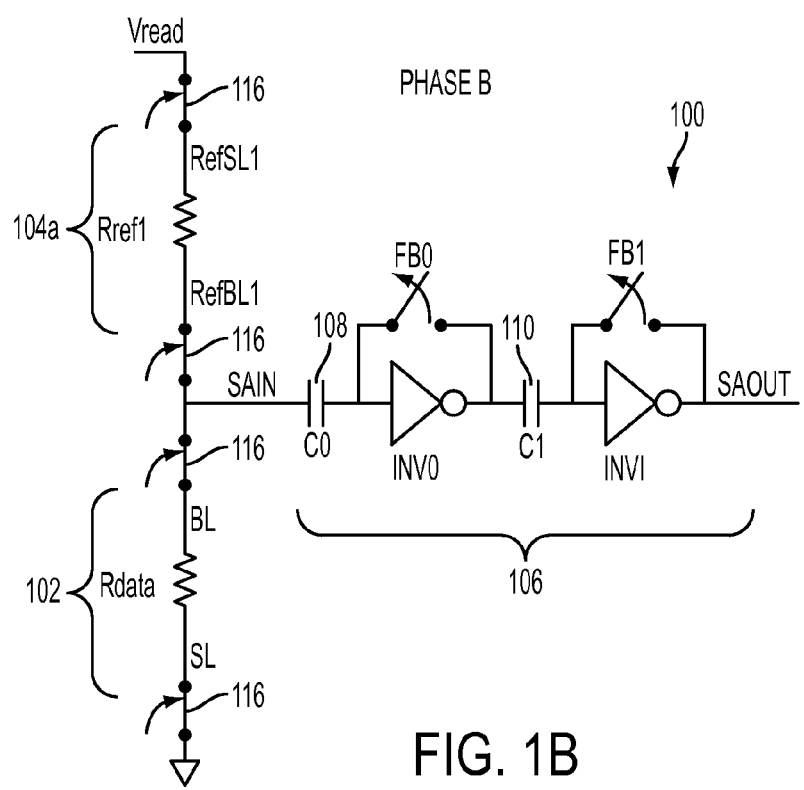
FIG. 1B is a schematic diagram of a second phase and configuration of a sensing circuit in accordance with one or more embodiments.

Turning now to a more detailed description of the present disclosure, FIGS. 1A and 1B are schematic diagrams showing Phase A and Phase B of a sensing circuit 100 in accordance with one or more embodiments. It should be noted that FIGS. 1A and 1B are greatly simplified for the purpose of explanation and clarity and generality. Not shown are several FETS in series with the MTJ resistances, including the selected array devices and the selected column select devices. These devices contribute series resistance, which will be relatively small in comparison to the MTJ resistance. Also not shown are the unselected cells and unselected column select devices.

As shown in FIG. 1A, in Phase A, sensing circuit 100 includes a memory cell (e.g., an STT-MRAM cell) 102, a first reference cell 104, a sample-and-hold sense amplifier circuit 106 and a switching system 116, configured and arranged as shown. Memory cell 102 includes a memory cell resistance (Rdata), a memory cell source line (SL) and a memory cell bit line (BL). First reference cell 102 includes a first reference cell resistance (Rref0), a first reference cell source line (RefSL0) and a first reference cell bit line (RefBL0). Switching system 116 includes multiple switches 116, arranged as shown. Sample-and-hold sense amplifier circuit 106 includes a sense amplifier input (SAIN), a sense amplifier output (SAOUT), a first capacitor 108, a second capacitor 110, a first inverting amplifier (INV0), a second inverting amplifier (INV1), a first feedback switch (FB0) and a second feedback switch (FB1), configured and arranged as shown. A second reference cell 104A is shown in FIG. 1B. Second reference cell 104A includes a second reference cell resistance (Rref1), a second reference cell source line (RrefSL1) and a second reference cell bit line (RrefBL1).

As shown in FIG. 1A, during Phase A switching system 116 connects selected memory cell 102 to first reference cell 104 in series by way of their respective bit lines and source lines to form a first resistive series voltage divider. As shown in FIG. 1B, during Phase B switching system 116 now connects selected memory cell 102 to second reference cell 104A in series by way of their respective bit lines and source lines to form a second resistive series voltage divider.

Figure 2:
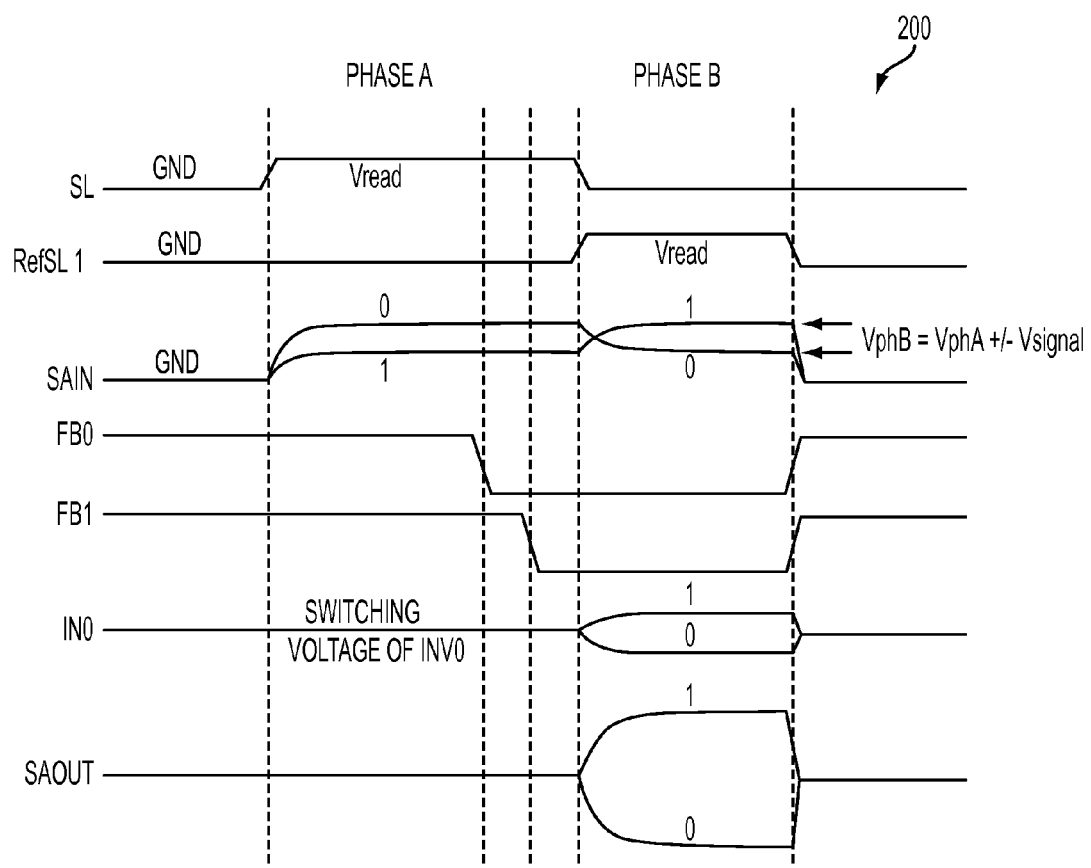
FIG. 2 is a timing diagram illustrating aspects the sensing circuit configurations shown in FIGS. 1A and 1B.

Phase A and Phase B of sensing circuit 100 will now be described with reference to a timing diagram 200 shown in FIG. 2. Prior to Phase A, the WL (not shown) is enabled. All bit lines (BLs) and source lines (SLs) are connected to ground (gnd). Feedback switches FB0, FB1 are closed, and the input of first inverting amplifier (IN0) is at the switching voltage of that amplifier (Vin=Vout). Phase A begins with switching system 116 (shown in FIGS. 1A and 1B) being enabled and configured such the memory cell source line (SL) is connected to Vread (e.g., 100 mV above gnd) and memory cell bit line (BL) and first reference cell bit line (RefBL0) are connected to SAIN. The voltage at SAIN then rises to a value of:

$$VphA = Vread * Rref0/(Rdata + Rref0)$$

The first and second feedback switches FB0, FB1 are then closed in sequence (FB0 followed by FB1). This is a known methodology that minimizes the impact of switching noise on first inverting amplifier INV0.

Phase B begins with switching system 116 (shown in FIGS. 1A and 1B) being enabled and configured such that second reference cell source line (RefSL1) is connected to Vread and second reference cell bit line (RefBL1) and memory cell bit line (BL) are connected to SAIN. All other BLs and SLs are connected to gnd. The voltage at SAIN rises or falls (depending on the state of selected memory cell 102) to a value of:

$$VphB = Vread * Rdata/(Rdata + Rref1)$$

The change in voltage at SAIN from Phase A to Phase B is amplified by sample-and-hold sense amplifier circuit 106 (shown in FIGS. 1A and 1B) to determine the state of the cell.

The relatively simple series voltage divider configuration of sensing circuit 100 allows it to be applied to a wide variety of array architectures and array biasing schemes. For example, instead of connecting memory cell bit line BL to ground during standby (i.e., prior to Phase A), first capacitor 108 at SAIN allows memory cell bit line BL to be connected to any desired BL standby voltage (Vbleq). In this case, the low end of the resistive divider should be connected to Vbleq and the high end to Vread. Vbleq can be chosen to maintain a desired separation between Vread and Vbleq (e.g., Vread−Vbleq=100 mV).

Alternatively, instead of using Vread and Vbleq, the high and low ends of the series voltage divider can be connected to read voltages (Vreadp, Vreadn) that are symmetrical around Vbleq. For example Vreadp could be set 50 mV above Vbleq, and Vreadn could be set 50 mV below Vbleq. In this case, the transient on SAIN is minimized, thereby improving performance. Additionally, the bit lines BLs or the source lines SLs may be connected to SAIN during the sensing phases. Because the time constant of the SAIN node is critical to the performance of sample-and-hold sense amplifier circuit 100, it may be preferable to connect the lower capacitance line (BL or SL) to SAIN.

Figure 3:
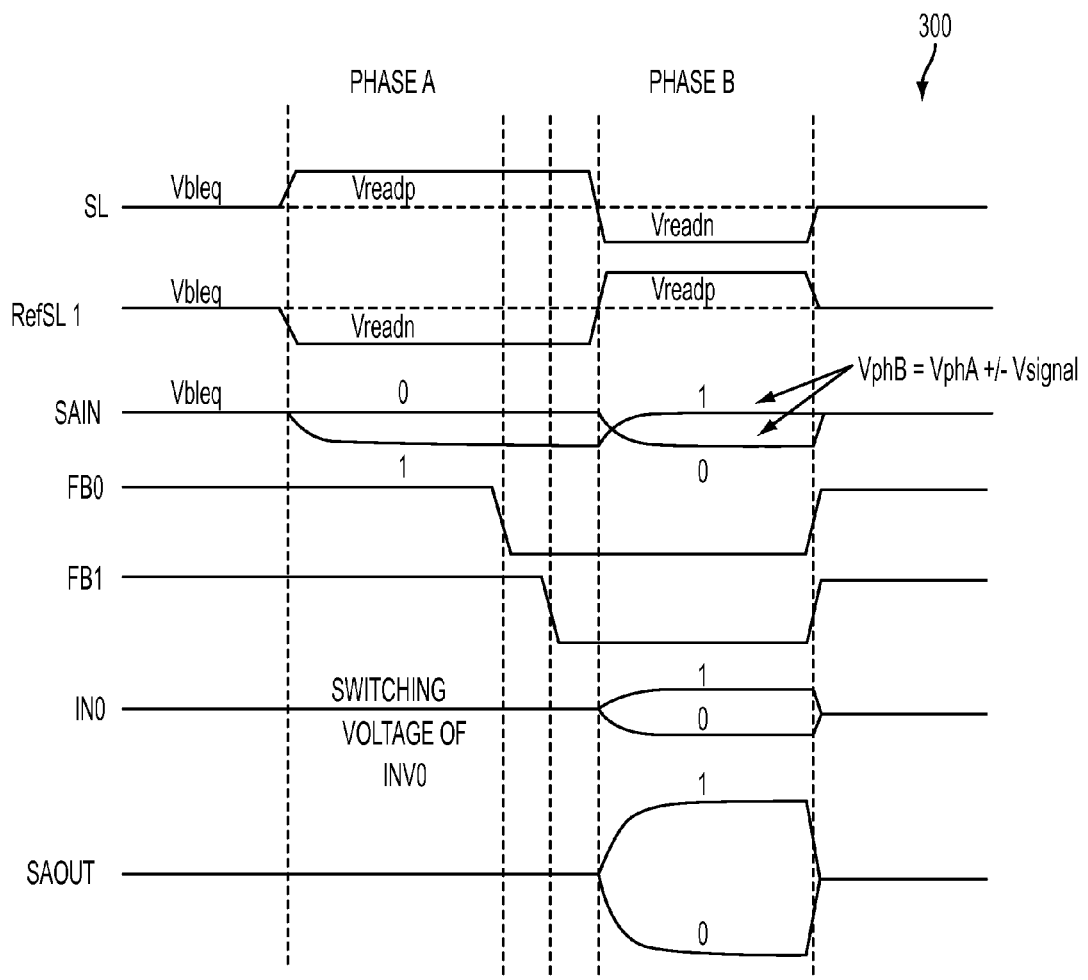
FIG. 3 is a timing diagram further illustrating aspects of the sensing circuit configurations shown in FIGS. 1A and 1B.

FIG. 3 illustrates a timing diagram 300 for a non-grounded BL standby, dual Vread configuration of sensing circuit 100. Prior to Phase A, the WL (not shown) is enabled. All bit lines (BLs) and source lines (SLs) are connected to Vbleq. Feedback switches FB0, FB1 are closed, and the input of first inverting amplifier (IN0) is at the switching voltage of that amplifier (Vin=Vout). Phase A begins with switching system 116 (shown in FIGS. 1A and 1B) being enabled and configured such the memory cell source line (SL) is connected to Vreadp (e.g., 50 mV above Vbleq) and memory cell bit line (BL) and first reference cell bit line (RefBL0) are connected to SAIN. The voltage at SAIN then rises to a value of:

$$VphA = Vreadp * Rref0/(Rdata + Rref0)$$

The first and second feedback switches FB0, FB1 are then closed in sequence (FB0 followed by FB1). This is a known methodology that minimizes the impact of switching noise on first inverting amplifier INV0.

Phase B begins with switching system 116 (shown in FIGS. 1A and 1B) being enabled and configured such that second reference cell source line (RefSL1) is connected to Vreadp and second reference cell bit line (RefBL1) and memory cell bit line (BL) are connected to SAIN. All other BLs and SLs are connected to Vbleq. The voltage at SAIN rises or falls (depending on the state of selected memory cell 102) to a value of:

$$VphB = Vreadp * Rdata/(Rdata + Rref1)$$

The change in voltage at SAIN from Phase A to Phase B is amplified by sample-and-hold sense amplifier circuit 106 (shown in FIGS. 1A and 1B) to determine the state of the cell.

FIGS. 4A-4D illustrate how the series voltage divider configuration of the present disclosure may be chosen to ensure that the first and second reference cells are not disturbed during sensing. The selected data cell may be assigned to either the upper or lower half of the divider during Phase A, as long as it is assigned to the opposite half during Phase B. However the assignment of which reference state to put above the data cell during either phase (and therefore which state to put below the data cell during the opposite phase) is an important choice, affecting the read disturb characteristics. Based on the position of the free layer (above the fixed layer and therefore connected to the BL, or below the fixed layer and therefore connected to the array FET and SL), and on whether the BLs or SLs are connected to SAIN (a design choice driven by other considerations), the reference states should be assigned consistent with FIGS. 4A-4D.

This assignment ensures that the reference cells are not disturbed, as the polarity of sensing bias applied to the reference cells is same as the polarity of the write voltage for that particular reference state. It also ensures that the data cell is only disturbed for one of the two phases and that the magnitude of the disturb voltage is nominally Vread/2. (For reference, it is a feature of STT MTJs that positive current into the free layer terminal will write the MTJ into the low resistance or zero (0) state, and vice-versa.

FIG. 4E lists expressions for the signal voltage, equivalent reference resistance and the ratio of nominal signal to nominal disturb voltage. In this simplified analysis, the series resistance of the array FET, BL, SL and column switches is ignored. The equivalent reference resistance is the data cell resistance at which SAOUT switches state. For this technique, the equivalent reference resistance is the geometric mean of the two reference cell resistances, which is the ideal value, assuming that either the area or the resistance of the MTJs is log-normally distributed. This is a very attractive feature of this technique.

Figure 5A:
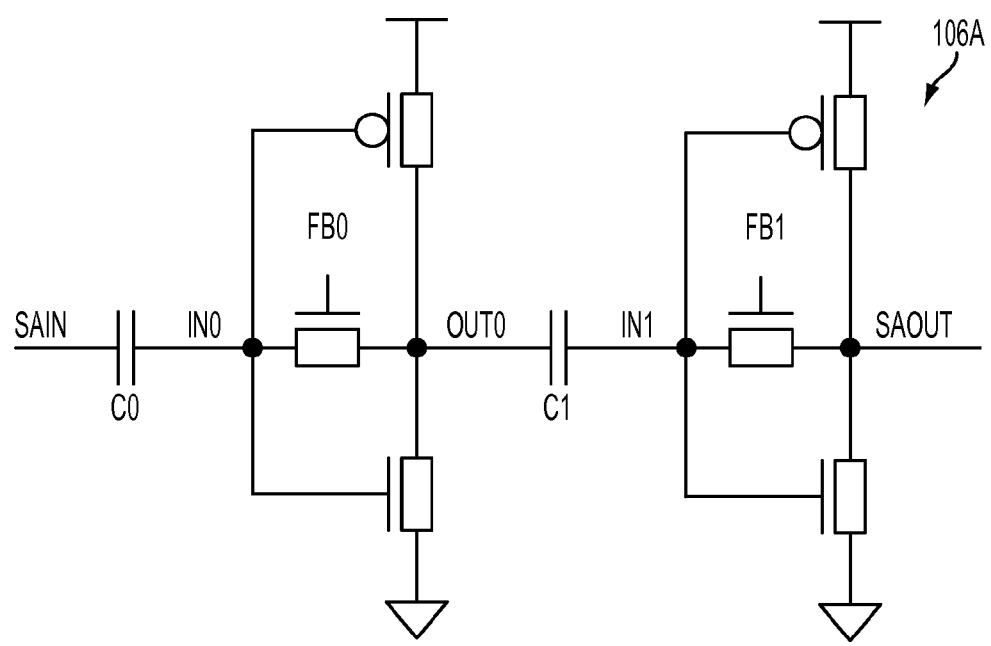
FIG. 5A-5C are schematic diagrams illustrating various alternative configurations for the sample-and-hold sense amplifier circuit shown in FIGS. 1A and 1B.
Figure 5B:
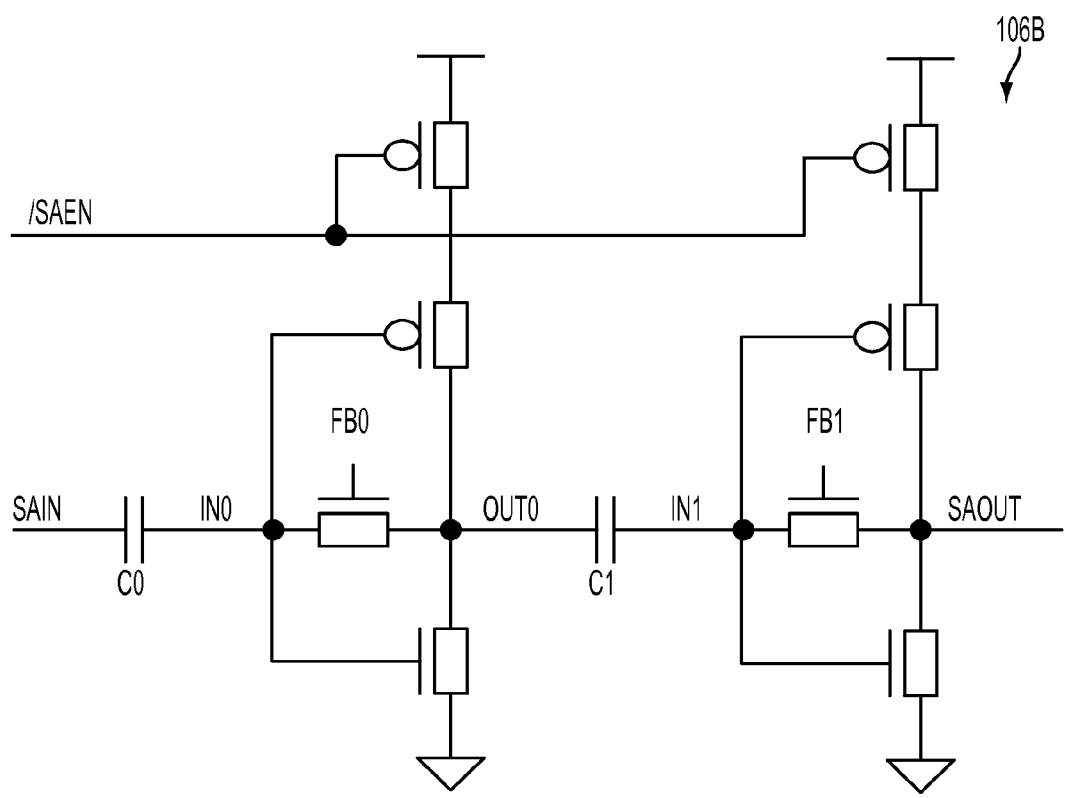
Figure 5C:
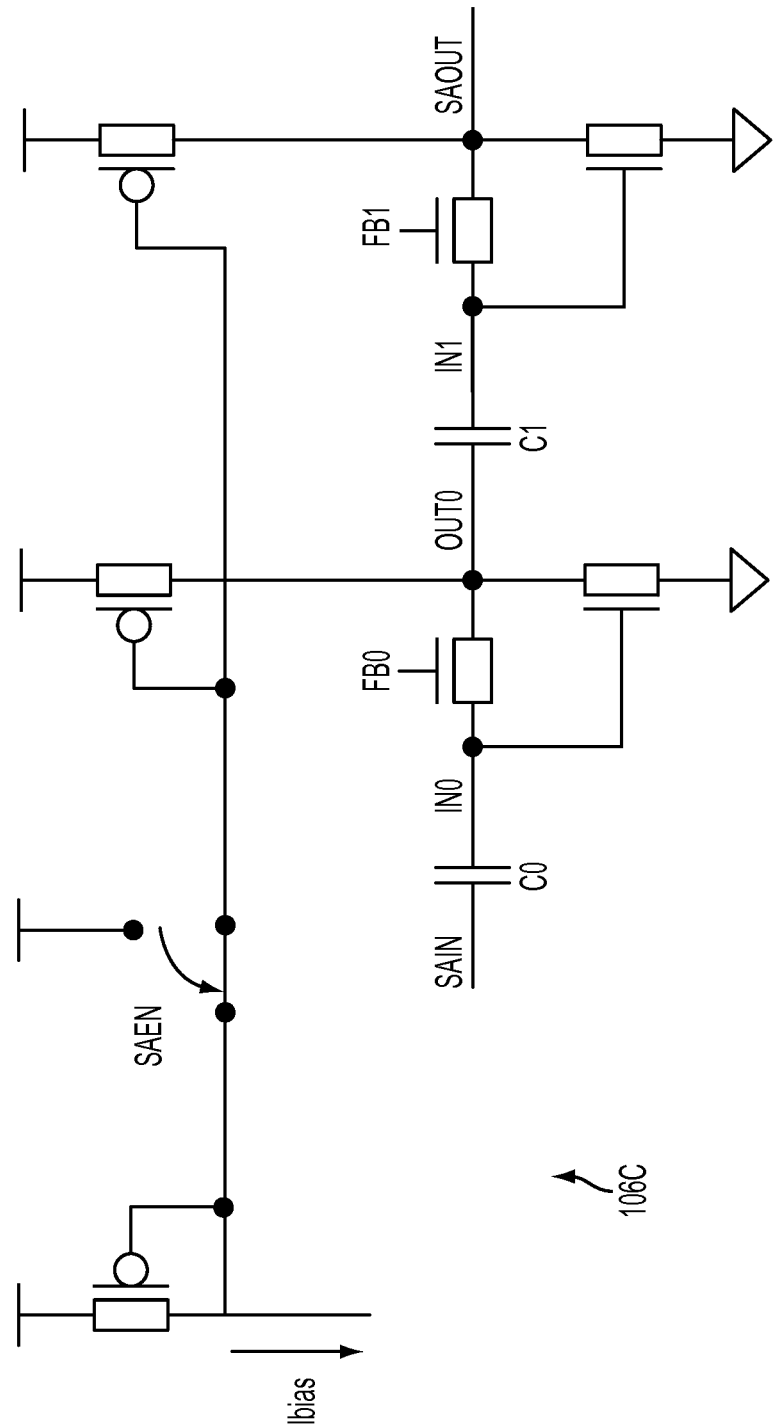

FIGS. 5A-5C illustrate at 106A, 106B and 106C, respectively, three known schematic implementations of the capacitively-coupled sample-and-hold sense amplifier circuit 106 (shown in FIGS. 1A and 1B). Because circuits 106A, 106B and 106C are known in the art, the text descriptions for these circuits are provided at a more general level, as follows. Each sense amplifier configuration 106A, 106B, 106C includes two stages. More or fewer stages may be used as long as the overall gain is sufficiently large that the small input signal is amplified to a convenient level at SAOUT. Each stage of sample-and-hold sense amplifier circuits 106A, 106B, 106C include three components: a single-ended input, single-ended output, high voltage gain, inverting amplifier; a capacitor in series with the input of the inverting amplifier; and a feedback switch between the input and output of the inverting amplifier. The capacitor could be a metal oxide semiconductor (MOS) capacitor, a metal insulator metal (MIM) capacitor or even a parasitic "back end of line" (BEOL) capacitor. The capacitor should be oriented to minimize the stray capacitance on the node representing the input of the inverting amplifier as this will maximize the coupling ratio across the capacitor. The feedback switch could be a complementary metal oxide semiconductor (CMOS) transfer gate or simply an NFET device, as shown. When the feedback switch is closed, the input and output of the inverting amplifier are equalized. On the Vout vs. Vin characteristic of the inverting amplifier, this represents the intersection of that curve with the 45 degree line (Vout=Vin). This is typically near 50% of the sense amplifier supply voltage (VDDSA) and is typically near the highest gain point on the curve. After the feedback switch is opened, any voltage change at SAIN is capacitively-coupled to the input of the inverting amplifier, then amplified by the gain of the inverting amplifier at that operating point. FET mismatch results in a shift of the Vout vs. Vin characteristic, yet the intersection with Vout=Vin remains in the high gain portion of the curve. For this reason the sense amplifier circuits 106A, 106B, 106C have a high immunity to FET mismatch.

More specifically, sense amplifier 106A shown in FIG. 5A uses a simple CMOS inverter as the inverting amplifier. This design is very simple and has high gain. However, when the feedback switch is closed the current flowing directly from the supply through the PFET and NFET to ground is relatively large and poorly controlled. The sense amplifier supply voltage (VDDSA) could be lowered as a method of controlling this power consumption. Sense amplifier 106B shown in FIG. 5B uses a CMOS inverter with an additional PFET header device as the inverting amplifier. The sizing and gate voltage of the header device provide methods for controlling the current when the feedback switch is closed. The header may also be turned off when the circuit is not in use, further reducing standby power consumption. Finally, sense amplifier 106C shown in FIG. 5B uses a current source load amplifier as the inverting amplifier. The PFET devices are operated as current sources and can be turned off when the circuit is not in use. Sense amplifier 106C has several advantages including that the input capacitance of the inverting amplifier includes only one device rather than two, thereby improving the capacitive coupling ratio at the input. Additionally, to the extent that the PFET devices are ideal current sources, sense amplifier 106C is completely immune to power supply (VDDSA) noise.

Figure 6:
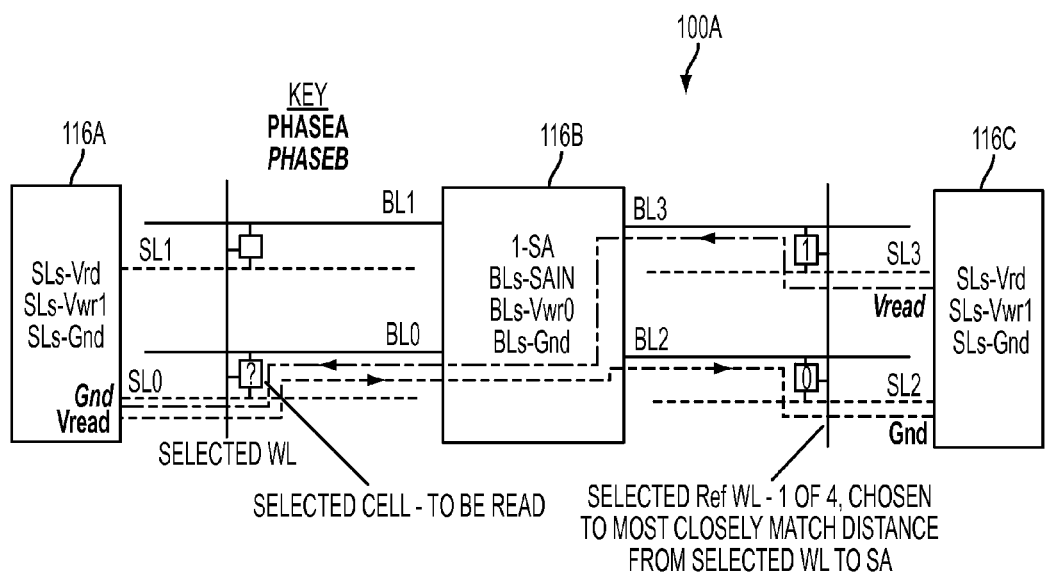
FIG. 6 is a schematic diagram illustrating an alternative configuration for the switching system of the sensing circuit shown in FIGS. 1A and 1B.

FIGS. 6, 7, 8 and 9 illustrate various sensing circuit configurations (100A, 100B, 100C, 100D), each including various options for configuring the switching system 116 (shown in FIGS. 1A and 1B) to establish the disclosed series voltage divider configuration of sensing circuit 100 (shown in FIGS. 1A and 1B). As shown in FIG. 6, three sets of switching systems 116A, 116B, 116C are arranged and configured as shown. Each cell has both a bit line and a source line. Four bit lines (BL0, BL1, BL2, BL3) are shown, and four source lines (SL0, SL1, SL2, SL3) are shown. Switching systems 116A, 116C, drive the source lines from the far right (SL2, SL3) and from the far left (SL0, SL1), respectively. Switching system 116B drives the bit lines from the middle (BL0, BL1, BL2, BL3). Inside each set of switching systems 116A, 116B, 116C are switches that switch the circuits shown inside each switching system. As shown, switching systems 116A, 116C connect the source lines (SLs) to Vread (Vrd), the write one (1) voltage (Vwr1) or to ground (gnd). Switching system 116B controls a sense amplifier (SA) that serves the four bit lines (BL0, BL1, BL2, BL3). Switching system 116B connects the bit lines to the sense amplifier (SA) at the SAIN node, the write zero (0) voltage (Vwr0) or ground (gnd). Symmetrically, the same connections are made on the far right side.

In addition to regular word lines (WLs), each array includes several (e.g., four) reference WLs distributed along the length of the BLs. When a data WL is selected in switching system 116A, the reference WL most closely matching the distance from the selected WL to SA is also selected in switching system 116C, and vice-versa. Along each reference WL, reference cells are programmed to an alternating 0101 pattern.

During Phase A, the selected data source line (SL0) is connected to Vread, and the data BL (BL0) and the BL having a zero-state reference cell (BL2 in FIG. 6) (RefBL0 in FIGS. 1A and 1B) are connected to SAIN. All other BLs and SLs are connected to ground (gnd). During Phase B, the source line having a one-state reference cell (BL3 in FIG. 6) (RefSL1 in FIGS. 1A and 1B) is connected to Vread, and BL3 (RefBL1 in FIGS. 1A and 1B) and the data bit line (BL0) are connected to SAIN. All other BLs and SLs are connected to ground. From here the voltage change can be determined, and the selected data cell is read. Alternatively, a similar implementation using SL to SAIN sensing could be achieved by simply swapping BLs and SLs in FIG. 6.

Figure 7:
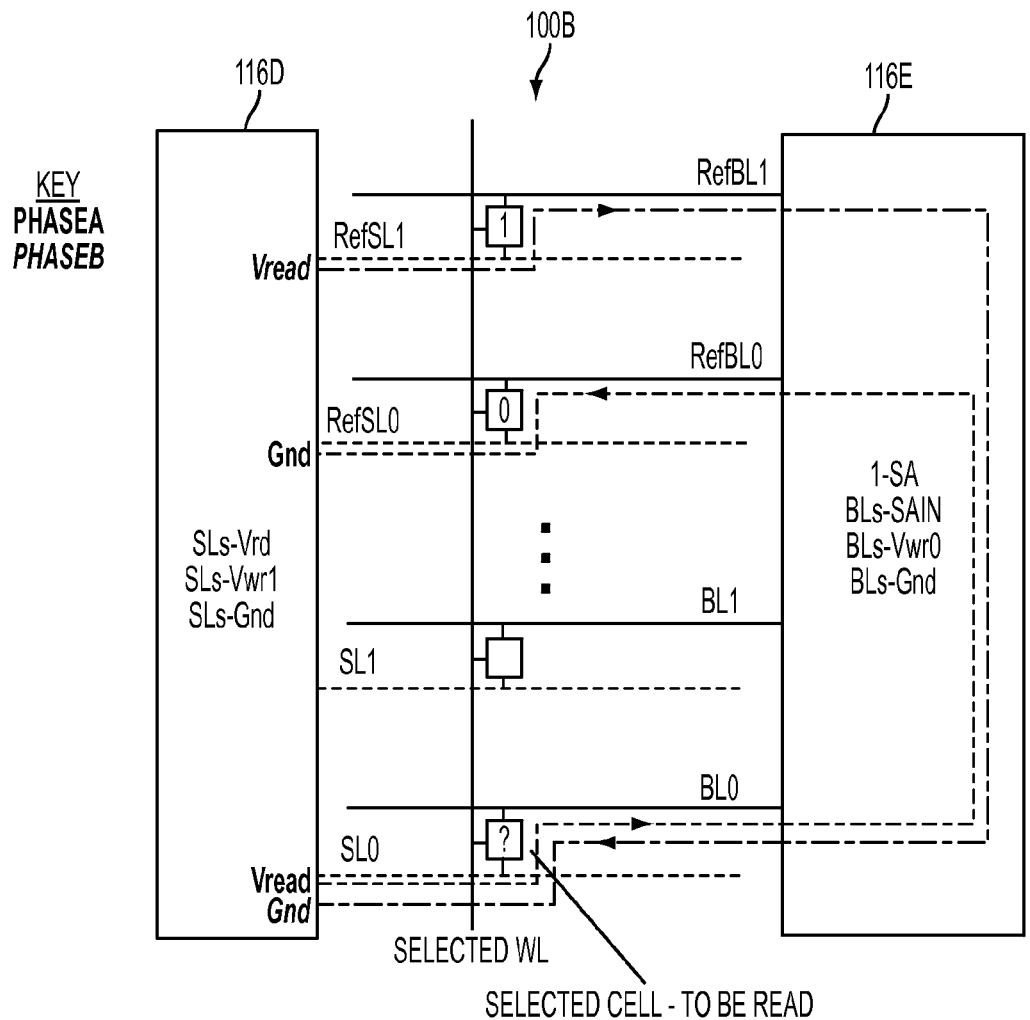
FIG. 7 is a schematic diagram illustrating another alternative configuration for the switching system of the sensing circuit shown in FIGS. 1A and 1B.

FIG. 7 illustrates a sensing circuit configuration 100B that includes another option for configuring the switching system 116 (shown in FIGS. 1A and 1B) to establish the disclosed series voltage divider configuration of sensing circuit 100 (shown in FIGS. 1A and 1B). As shown in FIG. 7, two switching systems 116D, 116E are arranged and configured as shown. Switching system 116E shares a sense amplifier (SA) among many bit lines (BL0, BL1), including two reference BLs (RefBL0, RefBL1), the cells of which are programmed to zero (0) and one (1), respectively. The bit lines (BLs) are serviced through switching system 116E by one sense amplifier (SA). Switching system 116E switches from each bit line (BL) to sense amplifier in (SAIN), write zero (0) voltage (Vwr0), and ground (gnd). The source lines (SLs) are serviced by switching system 116D, including switching from each source line (SL) to the read voltage (Vread), the write one (1) voltage (Vwr1) and ground (gnd).

During Phase A, switching system 116E connects the selected data source line SL (SL0) to the read voltage (Vread), and the data bit line (BL0) and the first reference bit line (RefBL0) are connected to SAIN. All other bit lines (BLs) and source lines (SLs) are connected to ground (gnd). During Phase B, switching system 116D connects the second reference cell source line (RefSL1) to the read voltage (Vread), and the second reference cell bit line (RefBL1) and the selected data cell bit line (BL0) are connected to sense amplifier in (SAIN). All other bit lines (BLs) and source lines (SLs) are connected to ground (gnd). Alternatively, a similar implementation using source line (SL) to sense amplifier in (SAIN) sensing could be achieved by simply swapping the bit lines (BLs) and (SLs) in FIG. 7.

Figure 8:
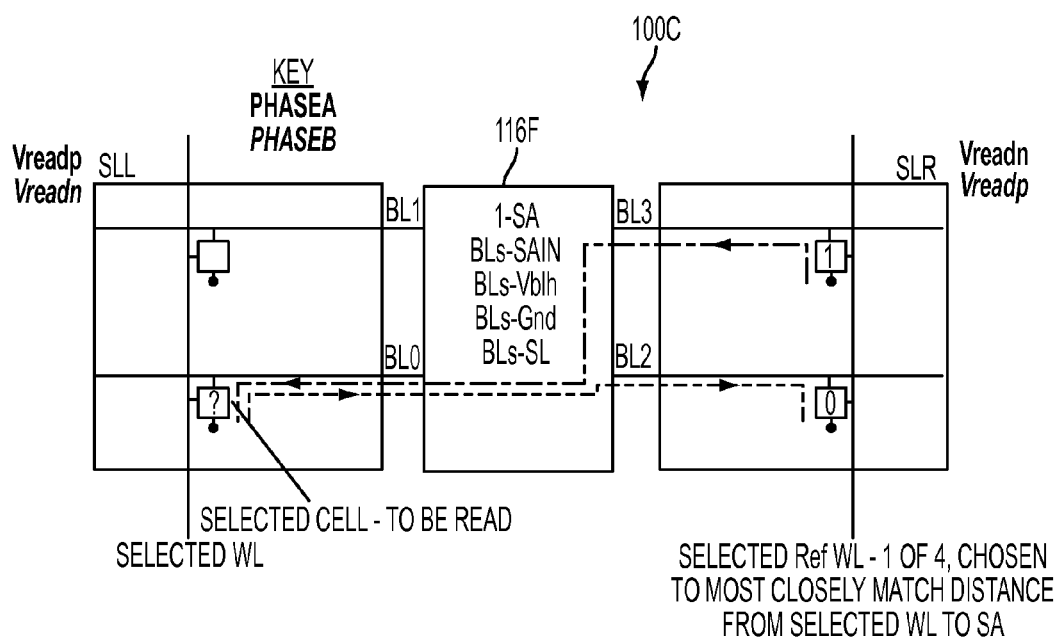
FIG. 8 is a schematic diagram illustrating another alternative configuration for the switching system of the sensing circuit shown in FIGS. 1A and 1B.

FIG. 8 illustrates a sensing circuit configuration 100C that includes another option for configuring the switching system 116 (shown in FIGS. 1A and 1B) to establish the disclosed series voltage divider configuration of sensing circuit 100 (shown in FIGS. 1A and 1B). To achieve maximum cell density, the source lines (SLs) of all cells within an array can be tied together in what is known as a single bit line (BL) configuration. Although not required, this configuration typically uses a mid-level bit line (BL) standby voltage (Vbleq) so that writes can be performed by simply moving the bit line (BL) to a bit line high voltage (Vblh) or to ground (gnd), while the shared source line (SL) is held at Vbleq.

As shown in FIG. 8, a switching system 116F shares one sense amplifier (SA) among four bit lines (BLs), two (BL0, BL1) in a left array and two (BL2, BL3) in a right array. Switching system 116F services the bit lines (BL0, BL1, BL2, BL3) and selectively switches from each bit line (BL0, BL1, BL2, BL3) to the sense amplifier in (SAIN), the bit line high voltage (Vblh), ground (gnd), and its corresponding source line (SL). When not otherwise selected, the bit line (BL) is connected to its corresponding source line (SL). This prevents word line (WL) half-selected cells from experiencing a disturbance when the source lines (SLs) are moved.

In addition to regular word lines (WLs), each array includes several (e.g., four) reference word lines (WLs) distributed along the length of the bit lines (BLs). When a data word line (WL) is selected in the left array, the reference word line (WL) most closely matching the distance from selected (WL) to the sense amplifier (SA) is also selected in the right array, and vice-versa. Along each reference word line (WL), reference cells are programmed to an alternating 0101 pattern.

During Phase A, the source line (SL) corresponding to the data array SLL (SL Left) is connected to Vreadp, the data bit line (BL0) and the first reference cell bit line (RefBL0) (i.e., bit line (BL) with zero-state reference cell, BL2 in FIG. 8) are connected to sense amplifier in (SAIN), and the source line (SL) corresponding to the reference array SLR (SL Right) is connected to Vreadn. All other BLs are connected to their corresponding SL. During Phase B, the data BL (BL0) and RefBL1 (BL with a one (1) state ref cell, BL3 in this example) are connected to SAIN, and the SL voltages are swapped relative to Phase A (SLL to Vreadn, SLR to Vreadp). All other BLs are connected to their corresponding SL.

Figure 9:
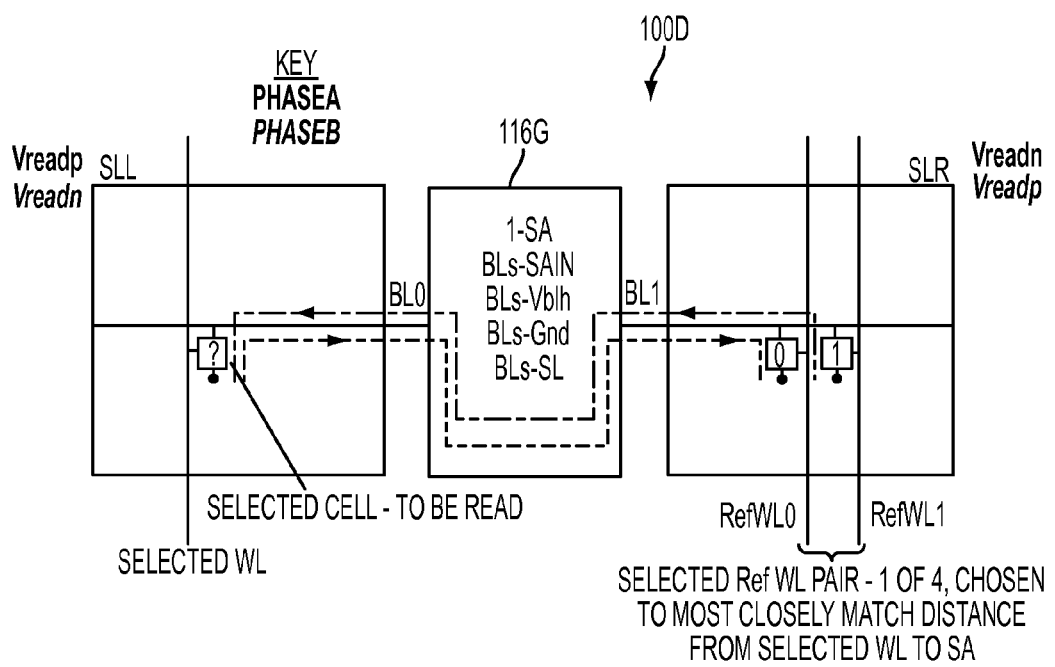
FIG. 9 is a schematic diagram illustrating another alternative configuration for the switching system of the sensing circuit shown in FIGS. 1A and 1B.

FIG. 9 shows at 100D an alternative to the sensing circuit 100C shown in FIG. 8. Rather than reconfigure the BL to SAIN connections between Phase A and Phase B, it may be desirable to have the switching system 116G leave the bit line (BL) connections static and activate separate reference word lines (WLs) during each of the two phases as illustrated in FIG. 9. This technique can be applied to a double bit line (BL) as well as single bit line (BL) cells.

Thus it can be seen from the foregoing detailed description that the present disclosure provides series voltage divider STT-MRAM sensing systems and methodologies that are largely insensitive to as-manufactured and age-related FET mismatch, provide control of the applied read voltage, allow a very simple area and power efficient sense amplifier, and are compatible with advanced node technologies.

The present disclosure uses system-level area and power to generate and control the forced parameter (e.g., Vread) at a relatively lower cost. Further, the forced parameter of the present disclosure is twice that of the current sense method because it is forced across two cells in series, allowing better control on a percentage basis. Additionally, combining the disclosed globally generated forced parameter scheme with offset cancelling provides significant protection against sensing errors in sensing systems that must be able to detect/sense very low sense parameters.

The simplicity of the disclosed series voltage divider sensing systems and methodologies provide a number of benefits. The series voltage divider matches easily with offset cancellation techniques making comparison of the sensed parameter largely insensitive to as-manufactured and age-related FET mismatch. The series voltage divider is very power efficient because it draws only one cell current from the system power supply because the data cell current also passes through the reference cells. The very simple series cell configuration allows for a similarly simple sensing amplifier, both of which support low power. Because the sensing amplifier design may be implemented as a CMOS inverter, which is the most fundamental circuit in CMOS logic, the design is highly compatible with advanced node technologies.

Additionally, the disclosed sensing technique provides a methodology to ensure that the reference cells are not disturbed. The selected data cell may be assigned to either the upper or lower half of the series voltage divider during Phase A, as long as it is assigned to the opposite half during Phase B. However, the assignment of which reference state to put above the data cell during either phase (and therefore which state to put below the data cell during the opposite phase) is an important choice, affecting the read disturb characteristics. Based upon the position of the free layer (above the fixed layer and therefore connected to the BL, or below the fixed layer and therefore connected to the array FET and SL) and upon whether the BLs or SLs are connected to SAN (a design choice driven by other considerations), the reference states should be assigned consistent with FIGS. 4A-4D. This assignment ensures that the reference cells are not disturbed, as the polarity of sensing bias applied to the reference cells is same as the polarity of the write voltage for that particular reference state. It also ensures that the data cell is only disturbed for one of the two phases and that the magnitude of the disturb voltage is nominally Vread/2. For reference, it is a feature of STT MTJs that positive current into the free layer terminal will write the MTJ into the low resistance or zero (0) state, and vice-versa.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the actions may be performed in a differing order or actions may be added, deleted or modified. Also, the term "coupled" describes having a signal path between two elements and does not imply a direct connection between the elements with no intervening elements/connections therebetween. All of these variations are considered a part of the disclosure.

It will be understood that those skilled in the art, both now and in the future, may make various improvements and enhancements which fall within the scope of the claims which follow.

What is claimed is:

1. A system for sensing a data state of a selected memory cell, the system comprising:
   a first reference cell;
   a sample-and-hold sense amplifier; and
   a switching system;
   wherein during a first sensing phase said switching system is configured to:
   open a first series communication path that places the selected memory cell in series with said first reference cell, thereby creating a first series voltage divider; and
   open a first branch communication path that taps an input of said sample-and-hold sense amplifier into a first divided voltage between the selected memory cell and said first reference cell.

2. The system of claim 1, wherein during said first sensing phase:
   the system is configured to apply a read voltage across said first series voltage divider;
   said sample-and-hold sense amplifier is configured to sample and hold said first divided voltage; and
   said first divided voltage comprises a first state of the selected memory cell.

3. The system of claim 2, wherein during a second sensing phase said switching system is further configured to:
   close said series communication path between the selected memory cell and said first reference cell;
   open a second series communication path that places the selected memory cell in series with a second reference cell, thereby creating a second series voltage divider; and
   open a second branch communication path that taps said input of said sample-and-hold sense amplifier into a second divided voltage between the selected memory cell and said second reference cell.

4. The system of claim 3, wherein during said second sensing phase:
   the system is further configured to apply said read voltage across said second series voltage divider;
   said sample-and-hold sense amplifier is further configured to sample and hold said second divided voltage; and
   said second divided voltage comprises a second state of the selected memory cell.

5. The system of claim 4, wherein:
   said sample-and-hold sense amplifier is further configured to amplify a difference between said first state and said second state; and
   a polarity of said amplified difference comprises the data state of the selected memory cell.

6. The system of claim 5, wherein said first series communication path comprises a bit line of the selected memory cell and a bit line of said first reference cell.

7. The system of claim 6, wherein said switching system is further configured to open said first branch communication path by coupling said input of said sample-and-hold sense amplifier to said bit line of the selected memory cell and said bit line of said first reference cell.

8. The system of claim 7, wherein, during said first sensing phase, the selected memory cell is at a higher electric potential than said first reference cell.

9. The system of claim 6, wherein said second series communication path comprises a bit line of the selected memory cell and a bit line of said second reference cell.

10. The system of claim 9, wherein said switching system is further configured to open said second branch communication path by coupling said input of said sample-and-hold sense amplifier to said bit line of the selected memory cell and said bit line of said second reference cell.

11. The system of claim 10 wherein, during said second sensing phase, said second reference cell is at a higher electric potential than the selected memory cell.

12. The system of claim 1, wherein:
   the selected memory cell comprise a free layer above a fixed layer; and
   during said first sensing phase, said first reference cell is at a higher electric potential than the selected memory cell.

13. The system of claim 1, wherein:
   the selected memory cell comprises a free layer below a fixed layer; and
   during said first sensing phase, the selected memory cell is at a higher electric potential than said first reference cell.

14. The system of claim 2, wherein:
   said sample-and-hold sense amplifier does generate and control said read voltage; and
   the system is further configured to generate and control said read voltage.

15. The system of claim 5, wherein:
said sample-and-hold sense amplifier does not generate and control said read voltage;
the system is further configured to generate and control said read voltage; and
said sample-and-hold sense amplifier is further configured to cancel a first voltage offset from said amplified difference.

16. A method for sensing a data state of a selected memory cell, the method comprising:
during a first sensing phase, opening a first series communication path that places the selected memory cell in series with a first reference cell, thereby creating a first series voltage divider; and
during said first sensing phase, opening a first branch communication path that taps an input of a sample-and-hold sense amplifier into a first divided voltage between the selected memory cell and said first reference cell.

17. The method of claim 16, further comprising:
during said first sensing phase, applying a read voltage across said first series voltage divider;
during said first sensing phase, using said sample-and-hold sense amplifier to sample and hold said first divided voltage; and
said first divided voltage comprising a first state of the selected memory cell.

18. The method of claim 17, further comprising:
during a second sensing phase, closing said series communication path between the selected memory cell and said first reference cell;
during said second sensing phase, opening a second series communication path that places the selected memory cell in series with a second reference cell, thereby creating a second series voltage divider; and
during said second sensing phase, opening a second branch communication path that taps said input of said sample-and-hold sense amplifier into a second divided voltage between the selected memory cell and said second reference cell.

19. The method of claim 18, further comprising:
during said second sensing phase, applying said read voltage across said second series voltage divider;
during said second sensing phase, using said sample-and-hold sense amplifier to sample and hold said second divided voltage; and
during said second sensing phase, said second divided voltage comprising a second state of the selected memory cell.

20. The method of claim 19, further comprising:
using said sample-and-hold sense amplifier to amplify a difference between said first state and said second state;
wherein a polarity of said amplified difference comprises the data state of the selected memory cell.

* * * * *